United States Patent
Rotondaro et al.

(10) Patent No.: US 6,544,906 B2
(45) Date of Patent: Apr. 8, 2003

(54) ANNEALING OF HIGH-K DIELECTRIC MATERIALS

(75) Inventors: Antonio L. P. Rotondaro, Dallas, TX (US); Mark R. Visokay, Richardson, TX (US); Luigi Colombo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/011,219

(22) Filed: Oct. 25, 2001

(65) Prior Publication Data

US 2002/0081826 A1 Jun. 27, 2002

Related U.S. Application Data

(60) Provisional application No. 60/257,641, filed on Dec. 21, 2000.

(51) Int. Cl.[7] ............................................. H01L 21/469
(52) U.S. Cl. ........................................................ 438/785
(58) Field of Search ................................. 438/585, 591, 438/765, 770–772, 775–777, 778, 785

(56) References Cited

U.S. PATENT DOCUMENTS

| | | | | |
|---|---|---|---|---|
| 4,495,219 A | * | 1/1985 | Kato et al. ................ | 427/126.3 |
| 5,436,410 A | * | 7/1995 | Jain et al. .................... | 174/250 |
| 5,486,488 A | * | 1/1996 | Kamiyama ........... | 148/DIG. 14 |
| 5,508,221 A | * | 4/1996 | Kamiyama .................. | 438/240 |
| 5,622,888 A | * | 4/1997 | Sekine et al. ................ | 438/398 |
| 6,150,209 A | * | 11/2000 | Sun et al. .................... | 438/240 |
| 6,246,105 B1 | * | 6/2001 | Morozumi et al. ......... | 257/637 |

OTHER PUBLICATIONS

Jang et al. "Method of manufacturing tantalum oxide containing . . . " Publication No. GB 2347778A Sep. 13, 2000.*
Jinriki et al. "Semiconductor device and its manufacture" Japanese Abstract Publication No. JP362234360A Oct. 14, 1987.*
Yamazaki et al. Japanese Publication No. JP408078694A. Mar. 22, 1996. (Abstract only).*
Van Zant, Peter "Microchip Fabrication" 3rd Ed. Mcgraw–Hill 1997. (pp. 159–160 and 166–170).*
Wolf et al. "Silicon Processing for the VLSI Era" Lattice Press 1986. (pp. 59–60).*

* cited by examiner

Primary Examiner—Craig Thompson
(74) Attorney, Agent, or Firm—Rose Alyssa Keagy; W. James Brady, III; Frederick J. Telecky, Jr.

(57) ABSTRACT

A method for annealing a high dielectric constant (high-k) gate dielectric layer includes placing a wafer including one or more partially formed transistors in an ambient. The ambient may include hydrogen and an oxidizing gas or the ambient may include nitrous oxide. Each transistor includes a high-k gate dielectric layer coupled to a substrate. The method further includes heating the high-k gate dielectric layer to a temperature greater than 650° C. while the gate dielectric layer is in the ambient. The ambient prevents or reduces the formation of lower dielectric constant (lower-k) material between the high-k gate dielectric layer and the substrate. Another method for annealing a high-k gate dielectric layer includes the use of an ambient including chemically active oxygen gas. When such an ambient is used, the high-k gate dielectric layer is heated to a temperature not greater than 600° C. while the gate dielectric layer is in the ambient.

24 Claims, 1 Drawing Sheet

ANNEALING OF HIGH-K DIELECTRIC MATERIALS

This application claims priority under 35 USC §119(e)(1) of provisional application Ser. No. 60/257,641 filed Dec. 21, 2000.

TECHNICAL FIELD OF THE INVENTION

This invention relates generally to the field of integrated circuit fabrication, and more specifically to a system and method for annealing dielectric materials.

BACKGROUND OF THE INVENTION

Metal oxide semiconductor (MOS) devices, including complementary MOS (CMOS) devices, have continued to decrease in size since their introduction many years ago. During this continuing decrease in feature size, various limitations to continued reduction in size have been encountered and-overcome. However, another such limitation, the thickness of the gate dielectric in a MOS device, is developing. The thickness of gate dielectrics has decreased over the years as new generations of smaller devices have been developed. In the past, silicon dioxide has typically been used as a gate dielectric. However, the continuing decrease in feature size and the resulting decrease in gate dielectric thickness suggests that silicon dioxide will soon no longer be an acceptable material for use as a gate dielectric. This is because the silicon dioxide used in these devices would have to be so thin that leakage current and other electrical defects become a significant problem.

One potential solution to this problem is to replace silicon dioxide (or other similar gate dielectric materials) with dielectric materials having a higher dielectric constant. Due to their higher dielectric constant (k), a thicker layer of such materials may be used to reduce the leakage current while providing similar gate capacitance and other benefits as a thinner layer of silicon dioxide. However, unlike silicon dioxide, such "high-k" materials typically must be deposited as a film instead of being grown. Such deposited films are often not stoichiometric and have defects affecting their electrical properties.

SUMMARY OF THE INVENTION

According to the present invention, disadvantages and problems associated with previous systems and methods for annealing high dielectric constant materials have been substantially reduced or eliminated.

In one embodiment of the present invention, a method for annealing a high dielectric constant (high-k) gate dielectric layer includes placing a wafer including one or more partially formed transistors in an ambient. The ambient may include hydrogen and an oxidizing gas or the ambient may include nitrous oxide. Each transistor includes a high-k gate dielectric layer coupled to a substrate. The method further includes heating the high-k gate dielectric layer to a temperature greater than 650° C. while the gate dielectric layer is in the ambient. The ambient prevents or reduces the formation of lower dielectric constant (lower-k) material between the high-k gate dielectric layer and the substrate.

Technical advantages of the present invention include the provisions of methods for annealing high-k gate dielectric layers that reduce or eliminate the formation of lower-k dielectric materials during the annealing process. Since high-k dielectric materials are often not stoichiometric and have defects affecting their electrical properties, these dielectric materials may be annealed to improve their electrical and physical characteristics and to properly oxidize the high-k gate dielectric material. However, many such annealing processes cause the growth of lower-k dielectric material due, at least in part, to the oxidizing environment. This lower-k dielectric material reduces the effectiveness of the high-k material used as the gate dielectric. Embodiments of the present invention reduce or eliminate the growth of these lower-k materials during the annealing process and thus improve the effectiveness of the high-k gate dielectric material while still allowing the dielectric material to be oxidized during the annealing process.

Other technical advantages are readily apparent to one skilled in the art from the following figures, descriptions, and claims.

BRIEF DESCRIPTION OF THE DRAWINGS

For a more complete understanding of the present invention, and for further features and advantages, reference is now made to the following description, taken in conjunction with the accompanying drawings, in which.

DETAILED DESCRIPTION OF THE INVENTION

Figure 1:
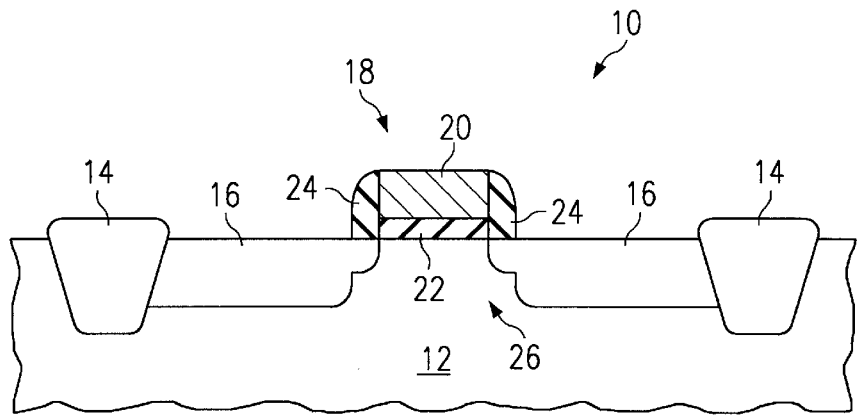
FIG. 1 illustrates an exemplary metal oxide semiconductor (MOS) transistor.

FIG. 1 illustrates an exemplary metal oxide semiconductor (MOS) transistor 10. Transistor 10 is formed on a semiconductor substrate 12. Isolation structures 14, such as shallow trench isolation structures, may be formed in substrate 12 to separate transistor 10 from other devices in-an integrated circuit in which transistor 10 may be included. For example, transistor 10 may be included as part of a complementary MOS (CMOS) integrated circuit or may be used in any other appropriate manner. Transistor 10 also includes source/drain regions 16 and a gate 18 that includes a gate electrode 20 and a gate dielectric layer 22. Gate dielectric layer 22 physically separates gate electrode 20 from substrate 12 and prevents or attempts to prevent an electrical current from flowing between gate electrode 20 and source/drain regions 16 or substrate 12 (or more specifically, a channel region 26 formed between source/drain regions 16). Spacers 24 may be located on either side of gate 18 to aid in the doping of source/drain regions 16.

A terminal (typically a metal conductor) is connected to gate electrode 20 and a terminal is connected to each source/drain region 16. In operation, an output voltage is created between the terminals connected to source/drain regions 16. An input voltage is then applied at the gate terminal to form an electrical field in channel region 26. This electrical field may be varied by changing the input voltage. This variance in the electrical field can be used to modulate the conductance of channel region 26 and thus control the current flow between source/drain regions 16.

With each passing year, the size of semiconductor devices, such as transistor 10, continues to decrease as demand increases for more devices to be fabricated on a single silicon wafer. As the size of these devices continually decreases, the various features of the devices are also scaled down. For example, the decreasing size of transistors 10 may create a need to decrease the thickness of gate dielectric layer 22 as well as the other elements of transistor 10. However, decreasing the gate dielectric thickness typically creates problems when traditional gate dielectric materials, such as silicon dioxide, are used.

The thickness and dielectric constant of gate dielectric layer 22 are typically chosen to create a gate capacitance appropriate for a particular use of transistor 10 (the gate capacitance controls the formation of the electrical field in channel region 26). The gate capacitance is directly proportional to the dielectric constant of gate dielectric layer 22 and inversely proportional to the thickness of gate dielectric layer 22. Therefore, as the other features of transistor 10 are scaled down, the thickness of gate dielectric layer 22 may also be scaled down proportionally to maintain an appropriate gate capacitance (assuming the dielectric constant of the material remains the same). However, as thinner gate dielectric layers are used, the leakage current through gate dielectric layer 22 increases, which adversely affects the operation of transistor 10.

This leakage current may be reduced or eliminated by increasing the thickness of gate dielectric layer 22 (with respect to its thickness after being scaled down). However, unless the dielectric constant of gate dielectric layer 22 is increased, then this increase in thickness will cause a decrease in gate capacitance (which is undesirable as transistor 10 is scaled down). Therefore, one potential solution to this problem is replace to the silicon dioxide (or other similar gate dielectric materials) with dielectric materials having a higher dielectric constant. Due to their higher dielectric constant (k), a thicker layer of such materials may be used to reduce the leakage current while providing the same gate capacitance and other benefits as a thinner layer of silicon dioxide. Examples of such "high-k" materials that may be used for gate dielectric layer 22 may include, but are not limited to, zirconium silicon oxides, hafnium silicon oxides, aluminum oxide, yttrium oxide, yttrium-silicon-oxides, lanthanum oxide, lanthanum silicon oxides, zirconium aluminate, hafnium aluminate, lanthanum aluminate, aluminum nitride, tantalum oxide, titanium oxide, zirconium oxide, hafnium oxide, zirconium oxynitride, hafnium oxynitride, zirconium silicon oxynitride, and hafnium silicon oxynitride. Any other appropriate high-k dielectric materials may also be used. The term "high-k dielectric material" should be understood to mean materials having a dielectric constant higher than the dielectric constant of silicon dioxide (which is 3.9).

Figure 2:
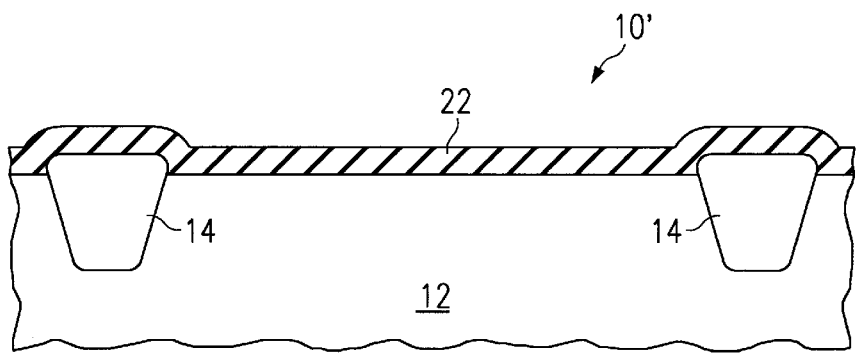
FIG. 2 illustrates a fabrication stage of a MOS transistor during which a gate dielectric material of the transistor may be annealed.

Unlike silicon dioxide, these high-k materials typically must be deposited (for example, using chemical vapor deposition) instead of being grown on substrate 12. Such deposited films are often not stoichiometric and may have defects or impurities affecting their electrical properties. In order to remove these impurities and to densify and fully oxidize a high-k gate dielectric layer 22, the layer 22 is typically annealed. FIG. 2 illustrates a fabrication stage 10' of transistor 10 during which gate dielectric material 22 may be annealed. This stage may occur before the creation of source/drain regions 16 or gate 18; however, gate dielectric layer 22 may alternatively be annealed at any other appropriate stage in the fabrication of transistor 10.

Figure 3:
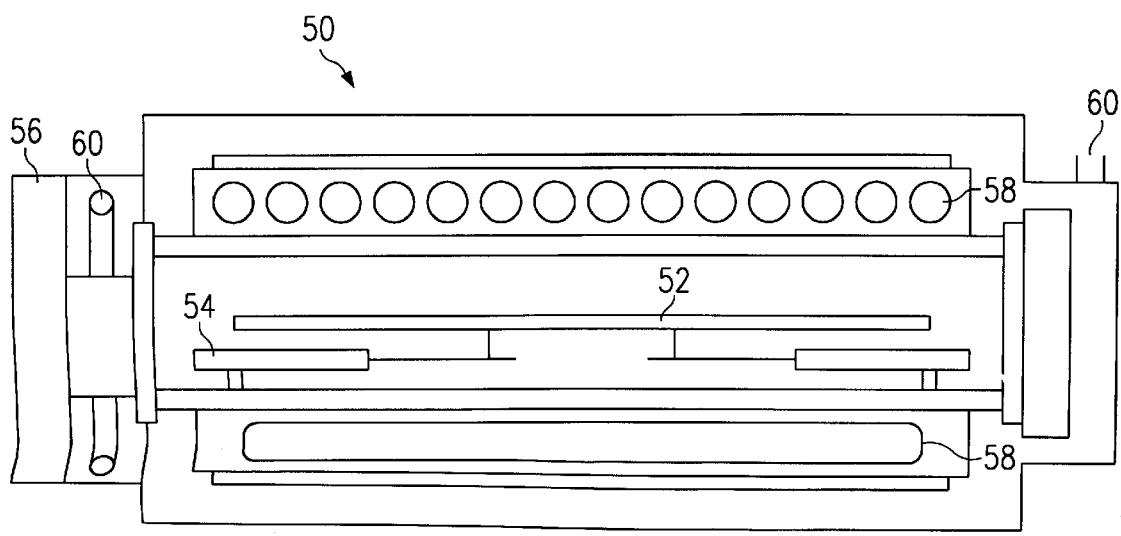
FIG. 3 illustrates an exemplary rapid thermal processing (RTP) system that may be used to anneal a high-k gate dielectric material.

FIG. 3 illustrates an exemplary rapid thermal processing (RTP) system 50 that may be used to anneal high-k gate dielectric material 22. RTP may also be referred to as rapid thermal annealing (RTA) and is typically performed at a high annealing temperature (meaning greater than approximately 650° C.). RTP system 50 uses radiation heating to anneal materials in a wafer 52 through rapid heating and cooling. In this process, wafer 52 (which may include one or more integrated circuits that include one or more gate dielectric layers 22) is placed in RTP system 50 on a tray 54. System 50 includes a door 56 through which wafer 50 may be placed on tray 54. Heat sources 58 are positioned above and/or below wafer 52 and are used to rapidly heat wafer 52. Heat sources 58 may include, but are not limited to graphite heaters, microwave units, and tungsten halogen lamps (which are illustrated). Heat sources 58 allow for rapid heating of wafer 52 (for example, typical heating rates may be around 75–125° C. per second) and rapid cooling of wafer 52 (since very short heating times are used and the body of wafer 52 may never reach the temperature of the surface of wafer 52).

RTP system 50 also includes process gas inlets and outlets 60 that allow a process gas or gases to be introduced into RTP system 50. In this manner, the ambient in which wafer 52 is annealed may be controlled. As described above, annealing may be used to purify, oxidize, and densify gate dielectric layer 22. RTP system 50 may be used to perform all of these annealing functions; however, an appropriate annealing ambient should be used. RTP has been used for densification using an inert ambient gas, such as nitrogen ($N_2$). However, the use of such an inert ambient does not serve to properly oxidize the annealed material. Alternatively, RTP has been used to oxidize materials and to remove impurities from the materials using an oxygen ambient gas. However, the use of an oxygen ambient may promote the growth of silicon dioxide or other "lower-k" dielectrics (for example, at the interface of gate dielectric layer 22 and substrate 12). Silicon dioxide or other lower-k dielectrics reduce the effective capacitance (and increase the equivalent oxide-thickness) of high-k gate dielectric layer 22 since the effective dielectric constant of gate dielectric layer 22 is reduced due to the introduction of a lower-k material between high k layer 22 and substrate 12.

Therefore, an ambient is desired that properly oxidizes gate dielectric layer 22 while reducing or eliminating the growth of interfacial lower-k dielectrics (those dielectric materials having a dielectric constant approximately the same as or close to silicon dioxide) during annealing. Certain embodiments of the present invention accomplish this result by using a hydrogen ($H_2$) and oxygen ($O_2$) ambient environment (a "wet oxidation" process). The presence of hydrogen promotes the generation of highly reactive oxygen (monatomic oxygen) that enables the annealing process time to be shortened (thus reducing the "thermal budget"). Furthermore, the hydrogen aids in the annealing or passivation of defects in gate dielectric layer 22 and thus allows for a further reduction of the thermal budget. Due to the reduction in the time that gate dielectric layer 22 is annealed, there is a corresponding reduction in the amount of interfacial lower-k dielectrics that are formed. In other words, the use of an $H_2+O_2$ annealing ambient results in a relative increase in the advantages of annealing (proper oxidation, purification, and densification) as compared to the disadvantage of annealing (the growth of lower-k dielectrics).

Any appropriate proportions of hydrogen and oxygen may be used in this annealing process. However, as the proportion of hydrogen increases, the annealing process becomes more "aggressive", causing both the oxidation of gate dielectric layer 22 and the formation of interfacial lower-k dielectrics to increase. The proper proportion of hydrogen may be chosen for a particular application by balancing the desire for rapid oxidation against unwanted interfacial growth. Furthermore, hydrogen may be used with any other appropriate oxidizer besides $O_2$. For example, the $O_2$ in the annealing ambient may be replaced by $N_2O$, NO, $O_3$, or any other appropriate oxidizers. As an alternative to the wet oxidation process described above (an annealing process using hydrogen), certain embodiments of the present inventions implement an RTP annealing process using a nitrous oxide ($N_2O$) ambient. Since no hydrogen is used, a nitrous oxide ambient provides dry oxidation. As compared to an oxygen ($O_2$) ambient, a nitrous oxide annealing ambient produces lower interfacial lower-k dielectric growth while providing substantially similar purification, densification, and proper oxidation of high-k gate dielectric layer 22. Furthermore, the use of nitrous oxide also results in negligible formation of NO (nitric oxide) by-products and thus there is little if any nitridation (incorporation of nitrogen) at the interface between gate dielectric layer 22 and substrate 12. Therefore, the nitrous oxide ambient results in a relative increase in the advantages of annealing (proper oxidation, purification, and densification) as compared to the disadvantage of annealing (the growth of lower-k dielectrics).

Although the embodiments described above use a high temperature RTP annealing process, yet other embodiments of the present invention may use a low temperature annealing process (meaning an annealing temperature of less than approximately 600° C.) to prevent or reduce the growth of lower-k dielectric material during the annealing of high-k gate dielectric layer 22. One advantage of the low annealing temperature (which is below approximately 600° C., but may preferably be less than approximately 300° C.), is that it reduces or eliminates the growth of interfacial lower-k dielectric material. Furthermore, the low temperature also reduces or eliminates crystallization of gate dielectric layer 22. This is advantageous since crystallization typically causes the leakage current through gate dielectric layer 22 to increase. However, this low temperature annealing is typically not used for densification.

Although the low temperature reduces or eliminates the growth of interfacial lower-k dielectric material, the low temperature also hampers the proper oxidation of high-k gate dielectric layer 22. Therefore, to attain the desired oxidation of high-k gate dielectric layer 22 while still preventing or reducing the growth of interfacial lower-k dielectric material, gate dielectric layer 22 is annealed in a chemically active oxygen environment. The use of this chemically active oxygen allows gate dielectric material 22 to be annealed at near room temperature conditions.

The active oxygen (for example, atomic oxygen or ionized oxygen) may be generated through excitation using plasma excitation (for example, using microwaves, radio frequency waves (RF), or direct current), ultraviolet excitation, or any other appropriate technique. For example, the anneal may be performed in a plasma asher that generates the active oxygen. Alternatively, ozone ($O_3$) or a gas mixture containing ozone may be provided as the annealing ambient. The annealing may be performed in such an active oxygen environment using any appropriate equipment.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims. As an example, it should be understood that transistor 10 is only an example of one type of device that may use a high-k gate dielectric and that embodiments of the present invention may be used in conjunction with the annealing of any appropriate component of any appropriate device

What is claimed is:

1. A method for annealing a high dielectric constant (high-k) gate dielectric layer, comprising:
   placing a wafer including one or more partially formed transistors in an ambient comprising hydrogen gas and an oxidizing gas, each transistor comprising a high-k gate dielectric layer coupled to a substrate; and
   heating the high-k gate dielectric layer to a temperature greater than 650° C. while the gate dielectric layer is in the ambient, the ambient preventing or reducing the formation of lower dielectric constant (lower-k) material between the high-k gate dielectric layer and the substrate.

2. The method of claim 1, wherein the heating is performed using a rapid thermal processing system.

3. The method of claim 1, wherein the oxidizing gas is selected from the group consisting of oxygen, nitrous oxide, nitric oxide, and ozone.

4. The method of claim 1, wherein the high-k gate dielectric layer comprises a material selected from the group consisting of zirconium silicon oxides, hafnium silicon oxides, aluminum oxide, yttrium oxide, yttrium silicon oxides, lanthanum oxide, lanthanum silicon oxides, zirconium aluminate, hafnium aluminate, lanthanum aluminate, aluminum nitride, tantalum oxide, titanium oxide, zirconium oxide, hafnium oxide, zirconium oxynitride, hafnium oxynitride, zirconium silicon oxynitride, and hafnium silicon oxynitride.

5. A method for fabricating a transistor having a high dielectric constant (high-k) gate dielectric layer, comprising:
   forming a high-k gate dielectric layer on a substrate; and
   annealing the substrate and high-k gate dielectric layer, the annealing comprising:
      placing the substrate and high-k gate dielectric layer in an ambient comprising hydrogen gas and an oxidizing gas; and
      heating the high-k gate dielectric layer to a temperature greater than 650° C. while the gate dielectric layer is in the ambient, the ambient preventing or reducing the formation of lower dielectric constant (lower-k) material between the high-k gate dielectric layer and the substrate.

6. The method of claim 5, wherein the heating is performed using a rapid thermal processing system.

7. The method of claim 5, wherein the oxidizing gas is selected from the group consisting of oxygen, nitrous oxide, nitric oxide, and ozone.

8. The method of claim 5, wherein the high-k gate dielectric layer comprises a material selected from the group consisting of zirconium silicon oxides, hafnium silicon oxides, aluminum oxide, yttrium oxide, yttrium silicon oxides, lanthanum oxide, lanthanum silicon oxides, zirconium aluminate, hafnium aluminate, lanthanum aluminate, aluminum nitride, tantalum oxide, titanium oxide, zirconium oxide, hafnium oxide, zirconium oxynitride, hafnium oxynitride, zirconium silicon oxynitride, and hafnium silicon oxynitride.

9. A method for annealing a high dielectric constant (high-k) gate dielectric layer, comprising:
   placing a wafer including one or more partially formed transistors in an ambient comprising nitrous oxide gas, each transistor comprising a high-k gate dielectric layer coupled to a substrate; and
   heating the high-k gate dielectric layer to a temperature greater than 650° C. while the gate dielectric layer is in the ambient, the ambient preventing or reducing the formation of lower dielectric constant (lower-k) material between the high-k gate dielectric layer and the substrate.

10. The method of claim 9, wherein the heating is performed using a rapid thermal processing system.

11. The method of claim 9, wherein the high-k gate dielectric layer comprises a material selected from the group consisting of zirconium silicon oxides, hafnium silicon oxides, aluminum oxide, yttrium oxide, yttrium silicon oxides, lanthanum oxide, lanthanum silicon oxides, zirconium aluminate, hafnium aluminate, lanthanum aluminate, aluminum nitride, tantalum oxide, titanium oxide, zirconium oxide, hafnium oxide, zirconium oxynitride, hafnium oxynitride, zirconium silicon oxynitride, and hafnium silicon oxynitride.

12. A method for fabricating a transistor having a high dielectric constant (high-k) gate dielectric layer, comprising:
    forming a high-k gate dielectric layer on a substrate; and
    annealing the substrate and high-k gate dielectric layer, the annealing comprising:
        placing the substrate and high-k gate dielectric layer in an ambient comprising nitrous oxide gas; and
        heating the high-k gate dielectric layer to a temperature greater than 650° C. while the gate dielectric layer is in the ambient, the ambient preventing or reducing the formation of lower dielectric constant (lower-k) material between the high-k gate dielectric layer and the substrate.

13. The method of claim 12, wherein the heating is performed using a rapid thermal processing system.

14. The method of claim 12, wherein the high-k gate dielectric layer comprises a material selected from the group consisting of zirconium silicon oxides, hafnium silicon oxides, aluminum oxide, yttrium oxide, yttrium silicon oxides, lanthanum oxide, lanthanum silicon oxides, zirconium aluminate, hafnium aluminate, lanthanum aluminate, aluminum nitride, tantalum oxide, titanium oxide, zirconium oxide, hafnium oxide, zirconium oxynitride, hafnium oxynitride, zirconium silicon oxynitride, and hafnium silicon oxynitride.

15. A method for annealing a high dielectric constant (high-k) gate dielectric layer, comprising:
    placing a wafer including one or more partially formed transistors in an ambient comprising chemically active oxygen gas, each transistor comprising a high-k gate dielectric layer coupled to a substrate; and
    heating the high-k gate dielectric layer to a temperature less than 400° C. or between 450–600° C. while the gate dielectric layer is in the ambient the ambient preventing or reducing the formation of lower dielectric constant. (lower-k) material between the high-k gate dielectric layer and the substrate.

16. The method of claim 15, wherein the chemically active oxygen gas is produced using plasma excitation.

17. The method of claim 15, wherein the chemically active oxygen gas is produced using ultraviolet excitation.

18. The method of claim 15, wherein the chemically active oxygen gas comprises a gas selected from the group consisting of atomic oxygen, ionized oxygen, and ozone.

19. The method of claim 15, wherein the high-k gate dielectric layer comprises a material selected from the group consisting of zirconium silicon oxides, hafnium silicon oxides, aluminum oxide, yttrium oxide, yttrium silicon oxides, lanthanum oxide, lanthanum silicon oxides, zirconium aluminate, hafnium aluminate, lanthanum aluminate, aluminum nitride, tantalum oxide, titanium oxide, zirconium oxide, hafnium oxide, zirconium oxynitride, hafnium oxynitride, zirconium silicon oxynitride, and hafnium silicon oxynitride.

20. A method for fabricating a transistor having a high dielectric constant (high-k) gate dielectric layer, comprising:
    forming a high-k gate dielectric layer on a substrate; and
    annealing the substrate and high-k gate dielectric layer, the annealing comprising:
        placing the substrate and high-k gate dielectric layer in an ambient comprising chemically active oxygen gas, each transistor comprising a high-k gate dielectric layer coupled to a substrate; and
        heating the high-k gate dielectric layer to a temperature less than 4000° C. or between 450–600° C. while the gate dielectric layer is in the ambient, the ambient preventing or reducing the formation of lower dielectric constant (lower-k) material between the high-k gate dielectric layer and the substrate.

21. The method of claim 20, wherein the chemically active oxygen gas is produced using plasma excitation.

22. The method of claim 20, wherein the chemically active oxygen gas is produced using ultraviolet excitation.

23. The method of claim 20, wherein the chemically active oxygen gas comprises a gas selected from the group consisting of atomic oxygen, ionized oxygen, and ozone.

24. The method of claim 20, wherein the high-k gate dielectric layer comprises a material selected from the group consisting of zirconium silicon oxides, hafnium silicon oxides, aluminum oxide, yttrium oxide, yttrium silicon oxides, lanthanum oxide, lanthanum silicon oxides, zirconium aluminate, hafnium aluminate, lanthanum aluminate, aluminum nitride, tantalum oxide, titanium oxide, zirconium oxide, hafnium oxide, zirconium oxynitride, hafnium oxynitride, zirconium silicon oxynitride, and hafnium silicon oxynitride.

* * * * *